(12) United States Patent  
Douriet

(10) Patent No.: US 6,215,377 B1
(45) Date of Patent: *Apr. 10, 2001

(54) LOW COST WIDEBAND RF PORT STRUCTURE FOR MICROWAVE CIRCUIT PACKAGES USING COPLANAR WAVEGUIDE AND BGA I/O FORMAT

(75) Inventor: Daniel F. Douriet, Fort Collins, CO (US)

(73) Assignee: Microsubstrates Corporation, Tempe, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/084,564
(22) Filed: May 26, 1998
(51) Int. Cl.[7] .......................................................... H01P 5/00
(52) U.S. Cl. ............................................. 333/247; 257/728
(58) Field of Search ................................... 333/246, 247; 257/728

(56) References Cited

U.S. PATENT DOCUMENTS 5,294,897 * 3/1994 Notani et al. ..................... 333/247 X
5,424,693 * 6/1995 Lin .................................... 333/246 X
5,832,598 * 11/1998 Greenman et al. ............... 333/247 X

FOREIGN PATENT DOCUMENTS 3-262302 * 11/1991 (JP) ...................................... 333/247

OTHER PUBLICATIONS

Panicker et al., "Ball Grid Arrays: A DC to 31.5 GHz Low Cost Packaging Solution for Microwave and MM–Wave MMICs", Microwave Journal, pp. 158–168, Jan. 1998.*

* cited by examiner

Primary Examiner—Justin P. Bettendorf
(74) Attorney, Agent, or Firm—Cantor Colburn LLP

(57) ABSTRACT

A MMIC package comprises a trace pattern of a coplanar wave guide which matches impedances at all transitions to enhance signal transmission and avoid reflection. The invention employs metalization on a dielectric substrate material wherein this metalization is patterned in order to provide gaps and signal carrying conductors which enhance the signal propagation and reduce impedance mismatches in order to provide a package capable of handling high frequency microwave signals.

6 Claims, 14 Drawing Sheets

30

30

LOW COST WIDEBAND RF PORT STRUCTURE FOR MICROWAVE CIRCUIT PACKAGES USING COPLANAR WAVEGUIDE AND BGA I/O FORMAT

BACKGROUND OF THE INVENTION

1. Field of the Invention

This invention is related to the field of packages for Microwave Circuits, especially in the frequency band from 20 GHz and higher.

2. Prior Art

In the growing market of Personal Communication Services there is the need for low cost, wideband, surface mounted, reliable, user friendly packages for Microwave Monolithic Integrated Circuits (MMIC) and other devices. Applications are already identified at 23, 28, 32 and 38 Ghz and the industry is approaching production within the next two years. There are also applications identified at 60, 70 Ghz and higher frequencies. The applications are based upon Gallium Arsenide MMIC's chips. These IC devices have been packaged using complex, high reliability, high cost packages, designed for low volume assembly.

Existing packages are Surface Mounted but they are predominantly leaded, and employ expensive materials. Extensive use is made of glass to metal seals, multilayer ceramic structures, machined metallic cases or substrates, expensive alloys (Cu—Mo, Kovar, CuW and others) and relatively thick gold plating.

Prior art packages use for their design and construction a mixture of several of the following: stripline, microstrip, coaxial, pseudocoaxial and coplanar waveguide transmission line structures. Therefore, achieving the desired bandwidth of the packages is more the result of educated guessing than a truly designed structure. Examples of such packages are described in a U.S. Patent to C. Mattei, et al, U.S. Pat. No. 4,276,558 to P. T. Ho et al, U.S. Pat. No. 5,014,115 to L. J. Moser and U.S. Pat. No. 5,450,046 to Y. Kosugi et al. Some truly wideband packages, up to 40 Ghz, like Dielectric Laboratories, Inc. DiPak Model 20001, or StratEdge's Models SEC-580234, and SEC-580231, available today are complex and expensive to build. DLI's package requires a cavity created in the mother PC board and wirebonds or ribbon bonds from the package containing the IC to the surface of the mother board. As is appreciated by one of skill in the art, wirebonds are fragile and need to be protected from the environment. Additionally, the length of the wirebonds must be precisely controlled for high frequency operation. The foregoing adds cost to the overall assembly. Also, conventionally attached and configured wirebonds introduce discontinuities in the electromagnetic field distributions and RF current configurations. Those discontinuities need to be "tuned-out" in prior art packages to eliminate signal reflections and losses that would otherwise be damaging to the performance of the package.

The StratEdge® packages have large tabs for installation or require wirebonds from the package to the mother PC board. Additionally, these packages occupy large areas of mother PC board and are therefore not desirable.

Because of the materials and precision of manufacturing required, present wideband package designs are not conducive to high production volume, standardization, miniaturization and portability while maintaining low cost.

Other limited bandwidth packages, such as Microsubstrates Corporation Via/Pak 224Z, 218Z and 220A, and those of Kyocera Corp., have similar characteristics to the packages from DLI and the StratEdge packages.

With the shift of MMIC's from high cost specialty applications to more mainstream commercial applications, the existing packages are very inadequate, for reasons of cost, difficult assembly, and difficulty regarding testing for both packages alone and after being fitted with the MMIC. The above drawbacks must be overcome to meet the growing demand for microwave radio applications, such as PCS and LMDS, for low cost, small size, and portability.

The deficiencies and limitations of the above package are eliminated or greatly alleviated by the present invention.

SUMMARY OF THE INVENTION

The above-discussed and other drawbacks and deficiencies of the prior art are overcome or alleviated by the MMIC package of the invention.

It is an object of the Invention to provide an efficient, loss minimizing MMIC package and connection to a mother PC board. The invention employs a coplanar waveguide RF port structure which is predictable in performance (through Electromagnetic computer Modeling) and for which design guidelines can be defined.

Another object of the Invention is to provide a low cost, surface mounted, reliable package for Microwave Circuits with an upper bandwidth frequency limited essentially by the capability of available manufacturing technologies and processes.

Still another object of the Invention is to provide a Microwave Circuit package with a ball grid array or bump grid array (BGA) format to facilitate machine assembly in a high volume manufacturing environment.

A final object of the Invention is to provide a Microwave Circuit package that is small in size, and is lightweight, as compared to packages of the prior art.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

The present invention is directed to connecting a MMIC to a mother PC board in a way that is electrically transparent to microwave signals transmitted therebetween. Achieving electrical transparency requires matching the impedance of the transmission path in the mother board, through the I/O connection between the motherboard and the package substrate, through the substrate itself, to the surface where the MMIC is installed and through the connection (e.g. wirebond, flip chip) to the MMIC. Achieving electrical transparency, and therefore the objects of the invention, is accomplished through the provision of a coplanar waveguide configuration that is impedance matched through all transition areas.

Figure 1:
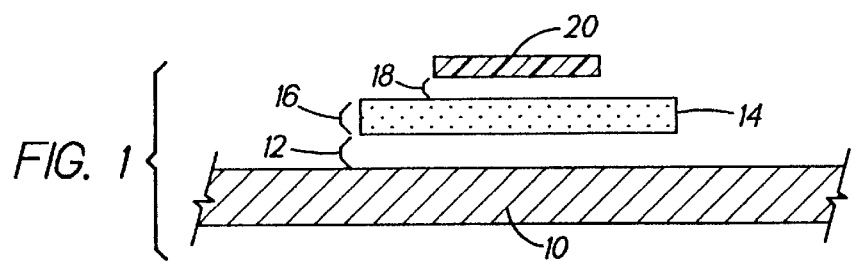
FIG. 1 is an exploded schematic view of a package substrate on a PC board and with a MMIC Chip.

The transition areas described are illustrated schematically in FIG. 1 wherein 10 indicates the mother board, 12 indicates the first transition area, 14 indicates the package substrate, 16 indicates the second transition area (through package 14); 18 indicates the third transition area and 20 indicates the MMIC (Microwave Monolithic Integrated Circuit).

Figure 2A:
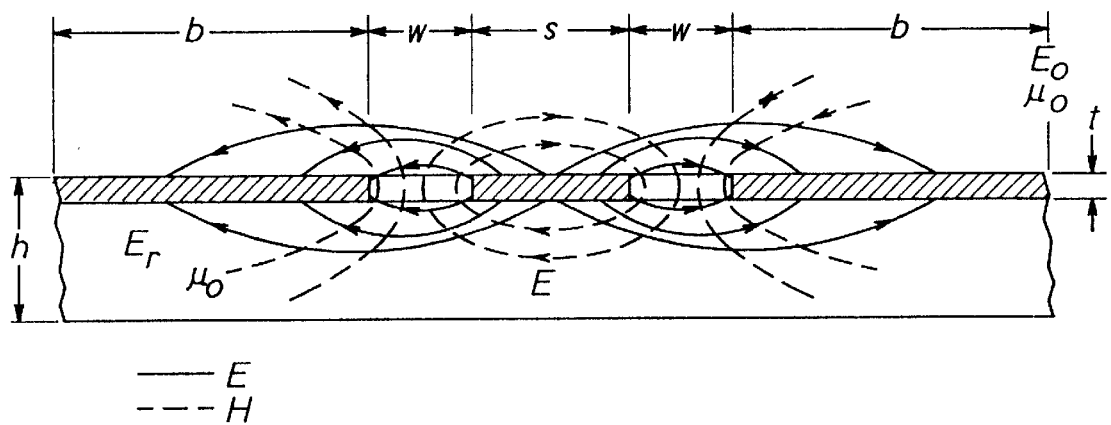
FIG. 2A is an end view of a coplanar waveguide structure of the invention illustrating field lines.
Figure 2B:
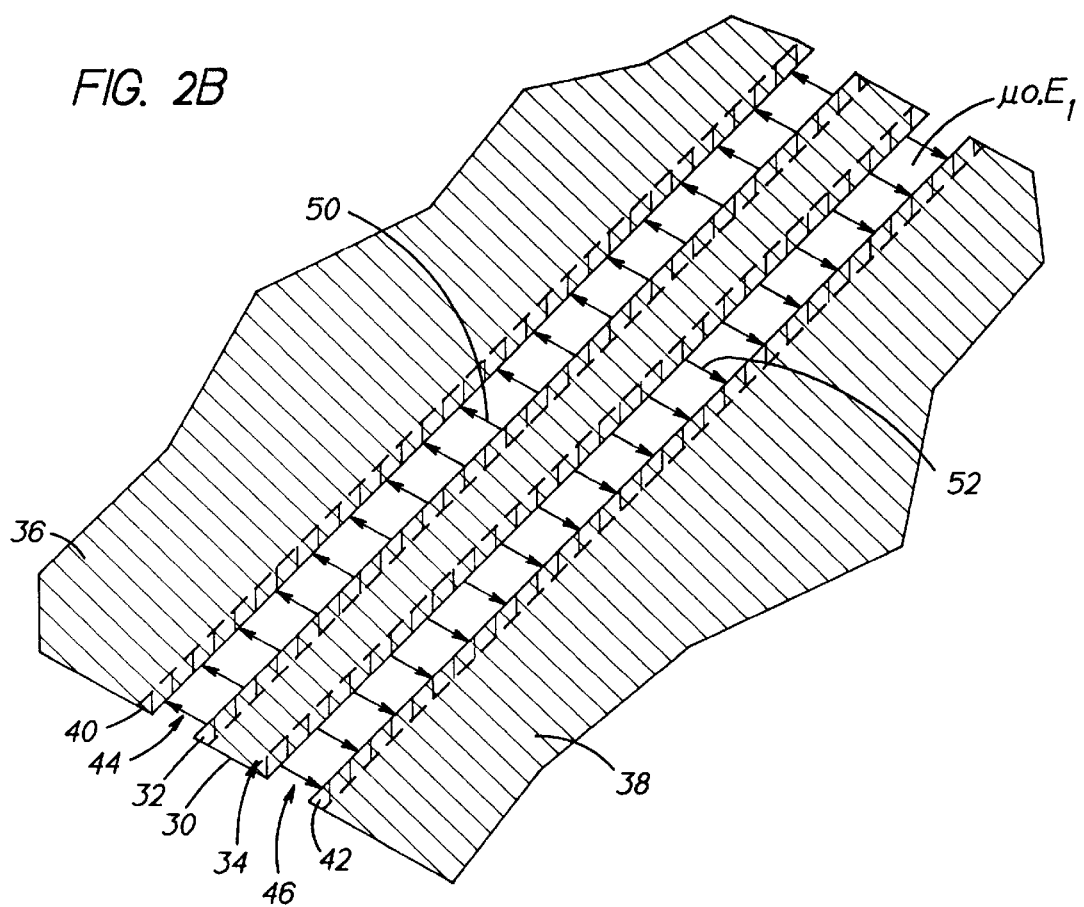
FIG. 2B is a perspective view of the structure of FIG. 2A.
Figure 2C:
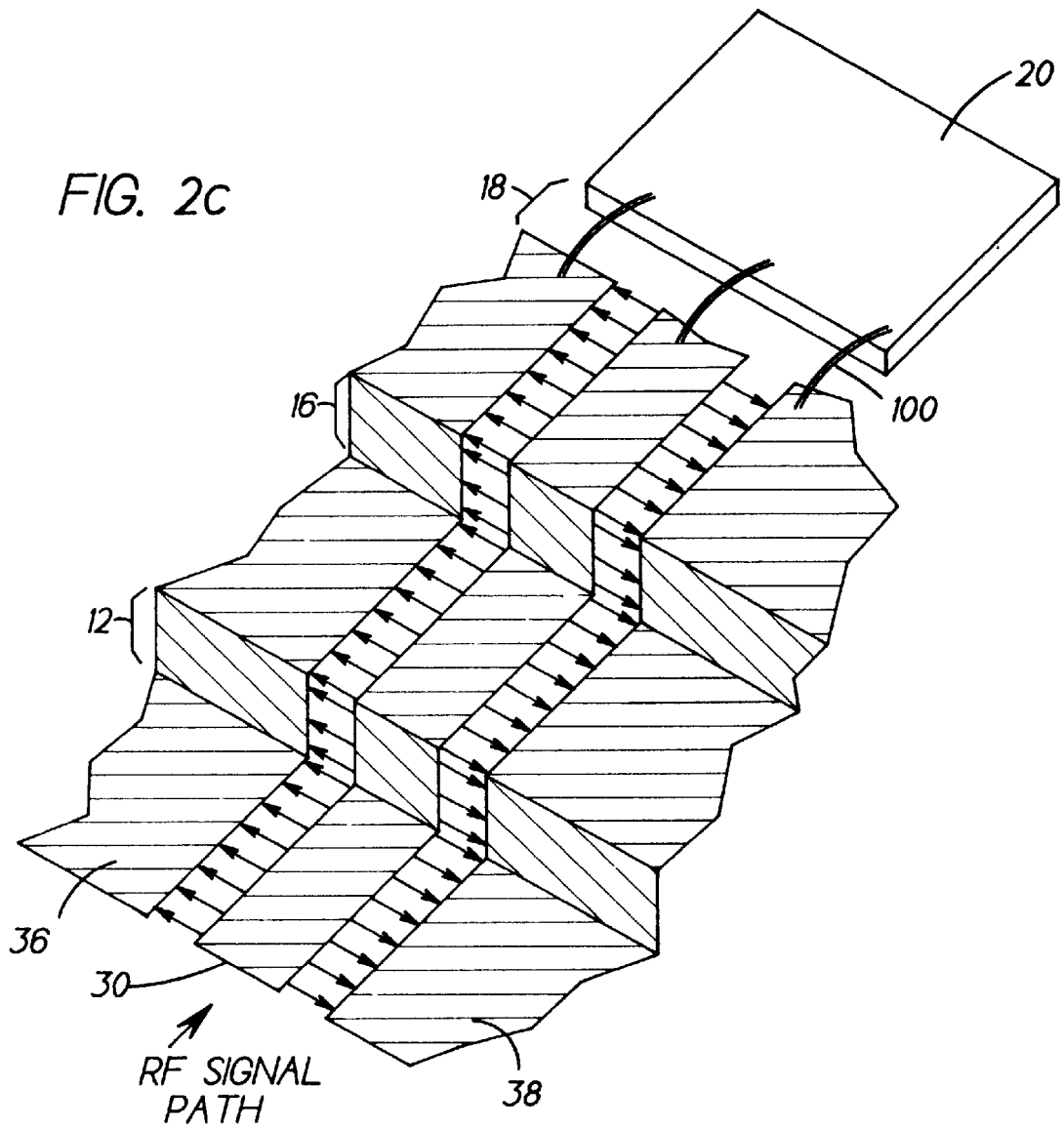
FIG. 2C is a schematic perspective view of the concept of the invention without any change in dielectric constant among the materials.

Referring to FIGS. 2A, 2B and 2C, a flat coplanar waveguide is illustrated. The illustration of FIG. 2B is as it relates to packages of the invention.

In FIG. 2B, the center trace 30 is the signal conductor while the metalization 36, 38 on either side thereof is the ground plane. The signal conductor 30 is spaced from the ground plane conductors 36 and 38 to control the inductance and capacitance of the circuit. Controlling those parameters by controlling the spacing between the conductors is one of the factors to consider for controlling the impedance of the circuit which is, of course, the ultimate goal in order to provide matched impedance pathways from the MMIC to the mother PC board and back.

RF currents in the respective conductors (signal and ground) flow in narrow regions adjacent the spacings 44, 46. The regions are identified by the numerals 32, 34 for the signal conductor 30 and by 40 and 42 for the respective ground plane conductors 36 and 38. Within spacings 44, 46 a spatial electric field configuration is shown by arrows 50 and 52. Spacings 44, 46 are essentially just gaps in the metalization which expose the dielectric material. This causes capacitance and inductance and modifies the electric field created between the conductors 30, 36 and 30, 38 as it passes therethrough.

Referring to FIG. 2C, the concept of the flat coplanar waveguide is applied to a multilevel construction. Multilevel constructions are typical for MMIC packages because of the need for PC board 10, a package 14 and the MMIC 20. In industry, these components are built by different manufacturers or units. The MMIC, therefore, is not simply connected directly to the mother PC board. There are a number of transitions (illustrated in FIGS. 1 and 2) and different materials properties to contend with and cross sectional dimensions become critical and complex in order to maintain impedance matching.

Figure 3:
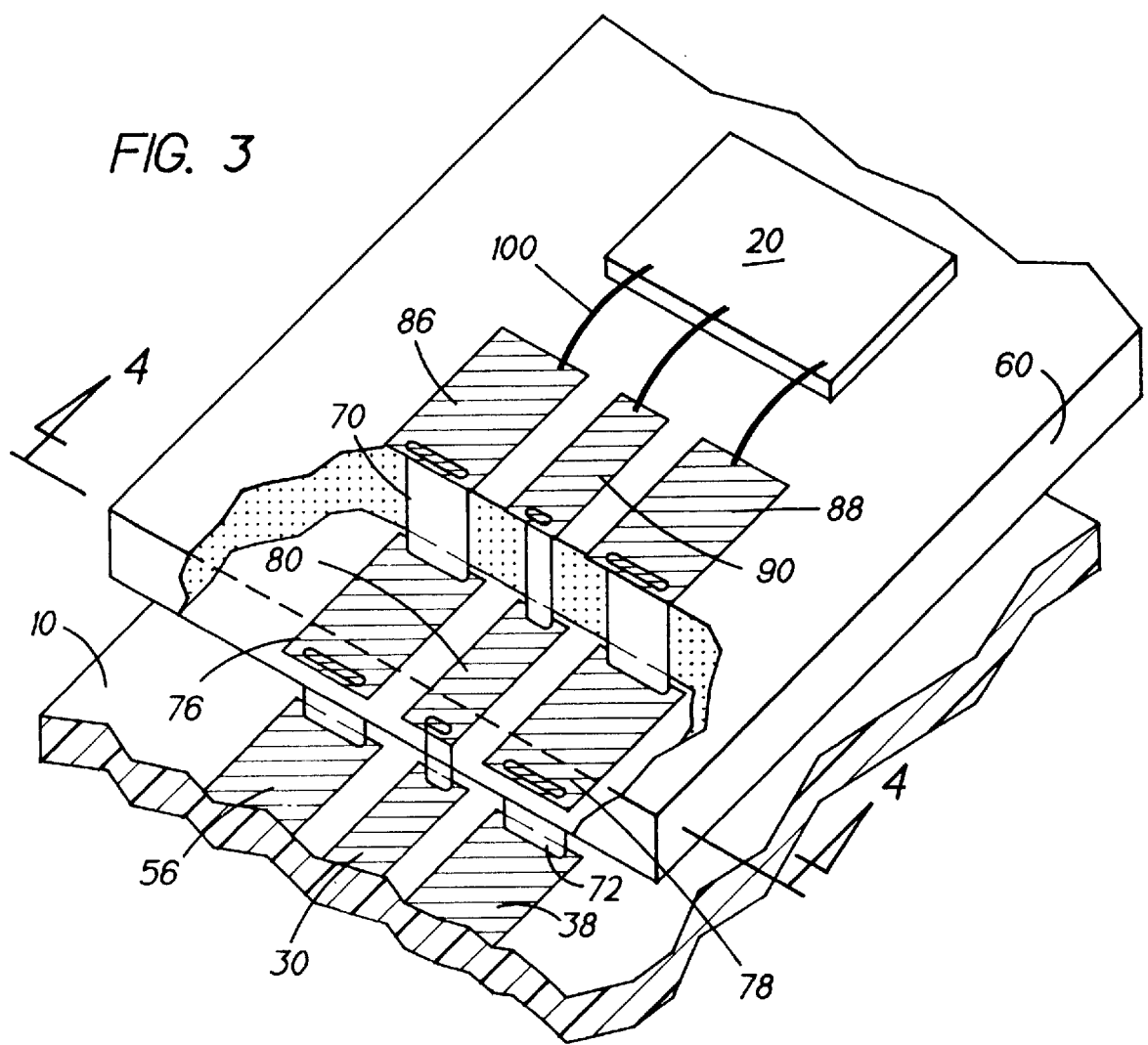
FIG. 3 illustrates a perspective view of an actual package of the invention.
Figure 4:
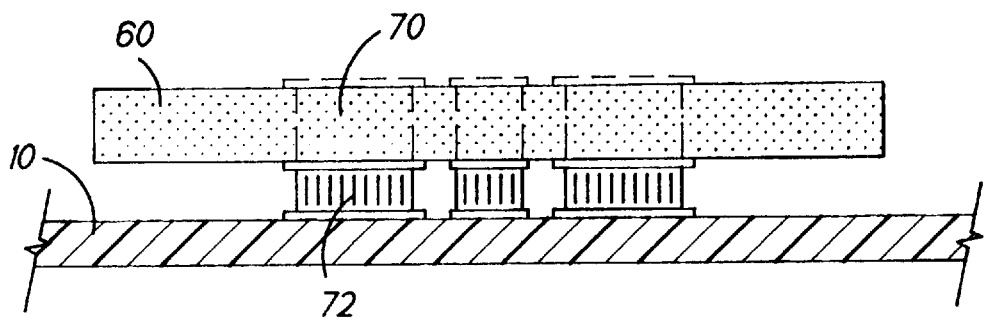
FIG. 4 is a cross section view of FIG. 3 taken along section line 4—4.

FIG. 2C broadly and schematically illustrates the concept of the invention without any change in dielectric constant among the materials. Transitions 1 and 2 are shown as idealized, zero thickness layers of electrically conductive material. This is particularly difficult to realize in practice, since transition 1 is between the mother PC board and the package substrate and transition 2 would occur inside the package substrate. The conductor structure of transition 1 is intended to bridge the gap (occupied by air) between the mother PC board and the package substrate and therefore requires considerable physical strength. FIGS. 3 and 4 illustrate an actual embodiment of the invention, where the thin layers of conductor material are replaced by thin and wide conductive stubs for transition 1 and by narrow and wide slots in package substrate filled with an electrically conductive material. This construction is very close to the ideal and is a preferred construction.

FIGS. 3 and 4 illustrate where the dielectric constants of the package 60 and the mother board 10 are the same and the two transitions of the waveguide structures are very close to the ideal. It is important to note that one of the factors in the representation of FIG. 3 that makes the transition ideal are the conductively filled slots 70 and stubs 72 that match the width of the conductors with which they make contact (30, 36, 38 on the mother board; 80, 76, 78 on the underside of the package; and 90, 86 and 88 on the top surface of the package substrate 60). Where the transitions are near ideal the length of, for example, signal conductor 90 can be very short. Without the ideal construction, certain Δl lengths (discussed from hereunder) must be maintained to reestablish and stabilize the coplanar wave electric field configuration. The lack of variation in dielectric constant in this figure enables the use of straight coplanar waveguide structures.

The FIG. 3 drawing also illustrates wirebonds 100 which have a decidedly less arcuate shape than conventional wirebonds. This further reduces distortion of the electric field configuration. In an alternative embodiment, which is discussed further hereunder (FIG. 9), the chip 20 may be desirably placed in a recess preferably as tall as the chip. This makes the top surface of the chip flush with the top surface of the substrate. The wirebonds that bridge the chip to the top surface of the substrate 60, then, can be virtually straight, reducing inductance.

In another preferred embodiment (FIGS. 5–5G) the stubs 72 are substituted for by balls or bumps. The balls (or bumps) and slots are a departure from the ideal structure of FIG. 2C; they introduce a slight discontinuity in the electric (and magnetic) field spatial configuration, i.e., a slight impedance mismatch. The discontinuation is compensated for by extending the center conductor 30, as it emerges from the signal ball and the signal slot, by a small length of preferably less than ¼ of the wavelength of the highest frequency to be transmitted. The feature is labeled Δl in FIG. 5.

It is a well known fact that in any transmission line or waveguide structure propagating a TEM (Transverse ElectroMagnetic) mode in the z direction, the characteristic impedance can be described by the following equation:

$$Z_o = F(x, y) \sqrt{\frac{\mu}{\epsilon}}$$

where F(x,y) is a scalar function of the transversal coordinates which depends on the waveguide cross sectional geometry, and $\mu$ and $\epsilon$ are the magnetic permeability and dielectric permitivity, respectively, of the propagating medium. In practically all cases, $\mu=\mu_o$, the magnetic permeability of free space. Therefore, the characteristic impedance of the waveguide varies inversely proportionally to the square root of the dielectric constant of the propagating medium.

To match the impedance of two sections of the waveguide built on materials of different dielectric constant, the cross sectional dimensions need to be adjusted by a scale factor equal to the square root of the ratio of the dielectric constants. Thus, if the package substrate is alumina, with a dielectric constant of about 9 and the mother PC board is made of a PTFE material, with a dielectric constant of about 3, then the mother PC board waveguide cross sectional geometry will be 1.732 (the square root of 3) times larger than that of the package substrate.

Figure 5:
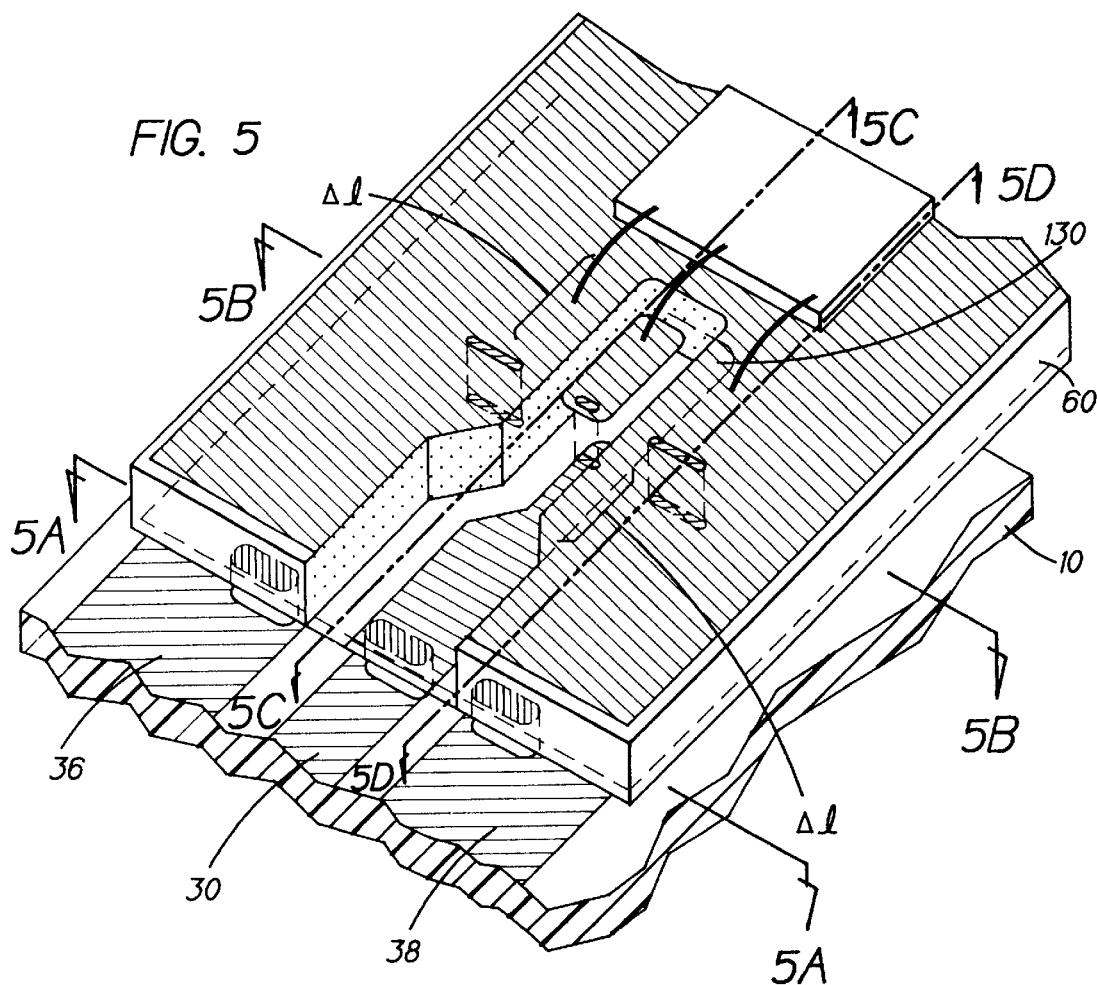
FIG. 5 is a perspective view of a preferred embodiment of the invention.
Figure 5A:
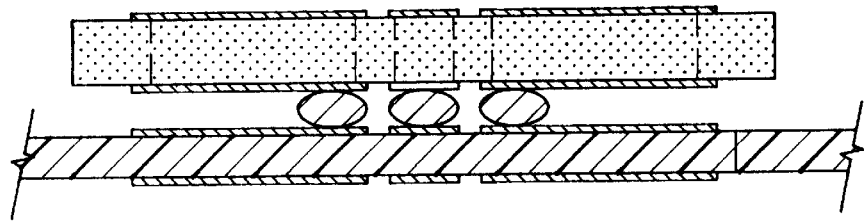
FIG. 5A is a cross section view of FIG. 5 taken along section line 5A—5A.
Figure 5B:
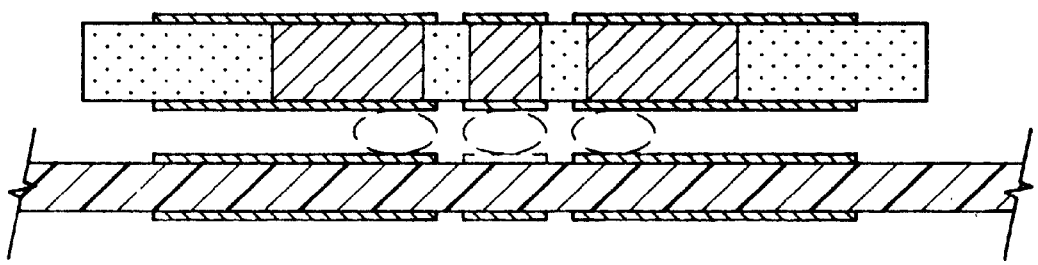
FIG. 5B is a cross section view of FIG. 5 taken along section line 5B—5B.
Figure 5C:
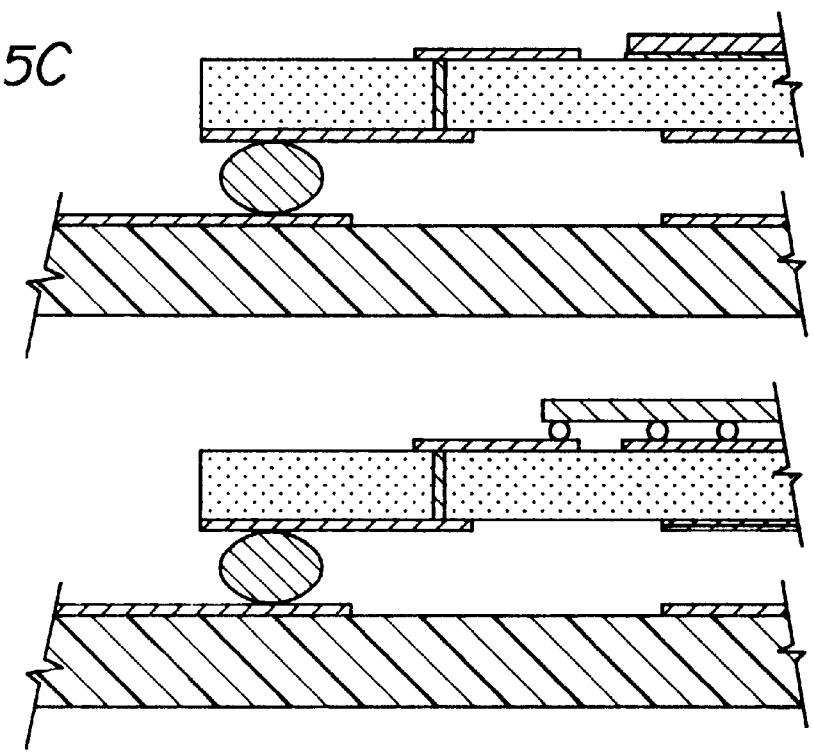
FIG. 5C is a cross section view of FIG. 5 taken along section line 5C—5C.
Figure 5D:
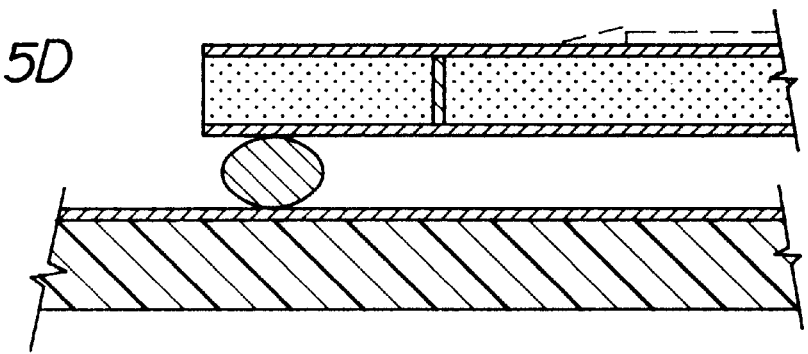
FIG. 5D is a cross section view of FIG. 5 taken along section line 5D—5D.
Figure 5E:
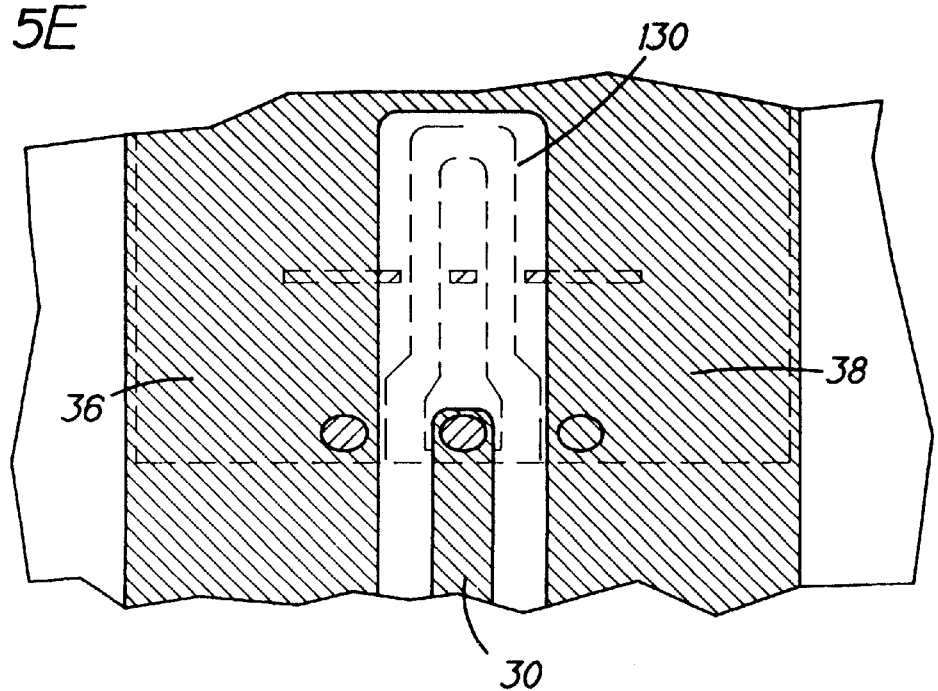
FIG. 5E is a top plan view of the PC board of FIG. 5.
Figure 5F:
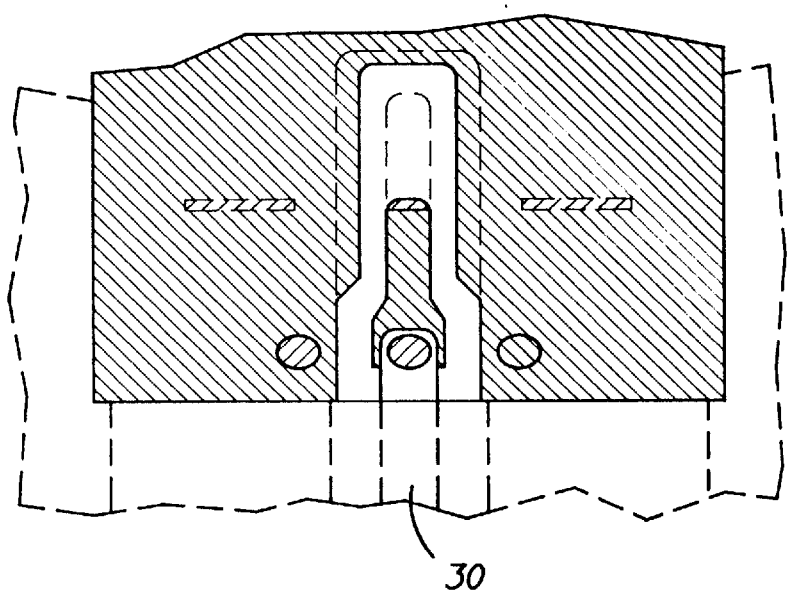
FIG. 5F is a bottom plan view of the package in FIG. 5.

The FIG. 5 drawing also illustrates wirebonds 100 which have a decidedly less arcuate shape than conventional wirebonds. This further reduces distortion of the electric field configuration. In an alternative embodiment, which is discussed further hereunder (FIGS. 9 AND 9A), the chip 20 may be desirably placed in a recess preferably as tall as the chip. This makes the top surface of the chip flush with the top surface of the substrate. The wirebonds that bridge the chip to the top surface of the substrate 60, then, can be virtually straight, reducing inductance.

Referring to the embodiment of FIGS. 5, and 5A–G, another embodiment of the RF port of the invention is illustrated. Preferably the package substrate 60 is constructed of a fully sintered high alumina material (about 99.6%). Slots 70 are preferably drilled in the sintered alumina with a carbon dioxide or YAG laser. The slots are filled with a conductive composite material such as copper-tungsten by means known to the art.

It is important to match the coefficient of thermal expansion of the substrate with that of the material filling the slots, to preserve a hermetic seal between the two materials and thus prevent the ingress into the package of foreign elements from the environment.

The coplanar waveguide structures are created by metallizing the package substrate by means of vapor deposited or sputtered thin films of metals, such as Titanium and Nickel or other suitable combinations of metals, such that there will be good adhesion to the package substrate and good electrical conductivity. The circuitry patterns are created by a well known photoresist-etch process or by physical masking and metal vapor deposition. The circuitry patterns are preferably coated with a thin layer of gold to provide high electrical conductivity for the microwave signals which is conducive to low power losses. The structures can also be created by screen printing and firing thick film conductive pastes or inks.

The connections of the coplanar waveguide from the bottom surface of the package to those of the mother board are made by conductive balls or bumps attached to the mother board by solder or a suitable electrically conductive material. The balls themselves are attached to the bottom waveguide structure of the package by means of soldering or brazing using a material that has a melting point higher than that of the solder used to connect the balls to the mother board.

The mother board itself is made of Alumina, Teflon composites, or other insulating material with a loss tangent in the vicinity of 0.0004 within the frequency bandwidth of the package.

Figure 5G:
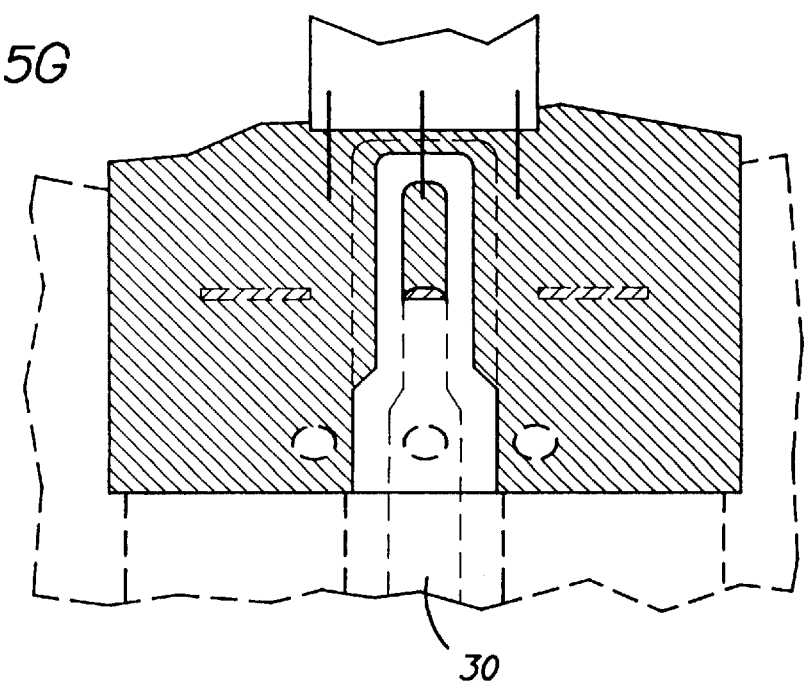
FIG. 5G is a top plan view of the package in FIG. 5.

FIGS. 5 through 5G illustrate construction details of a preferred embodiment of the package of the invention as follows: FIG. 5 shows the ground plane 38, 36 of the coplanar waveguide on the mother PC board 10 with an opening 130 that extends beyond the end of the signal conductor 30. There is no mother board ground plane under the coplanar waveguide structures of the package. This feature eliminates the presence of parasitic impedances with the package structures that would be introduced by the presence of that ground plane.

Figure 6:
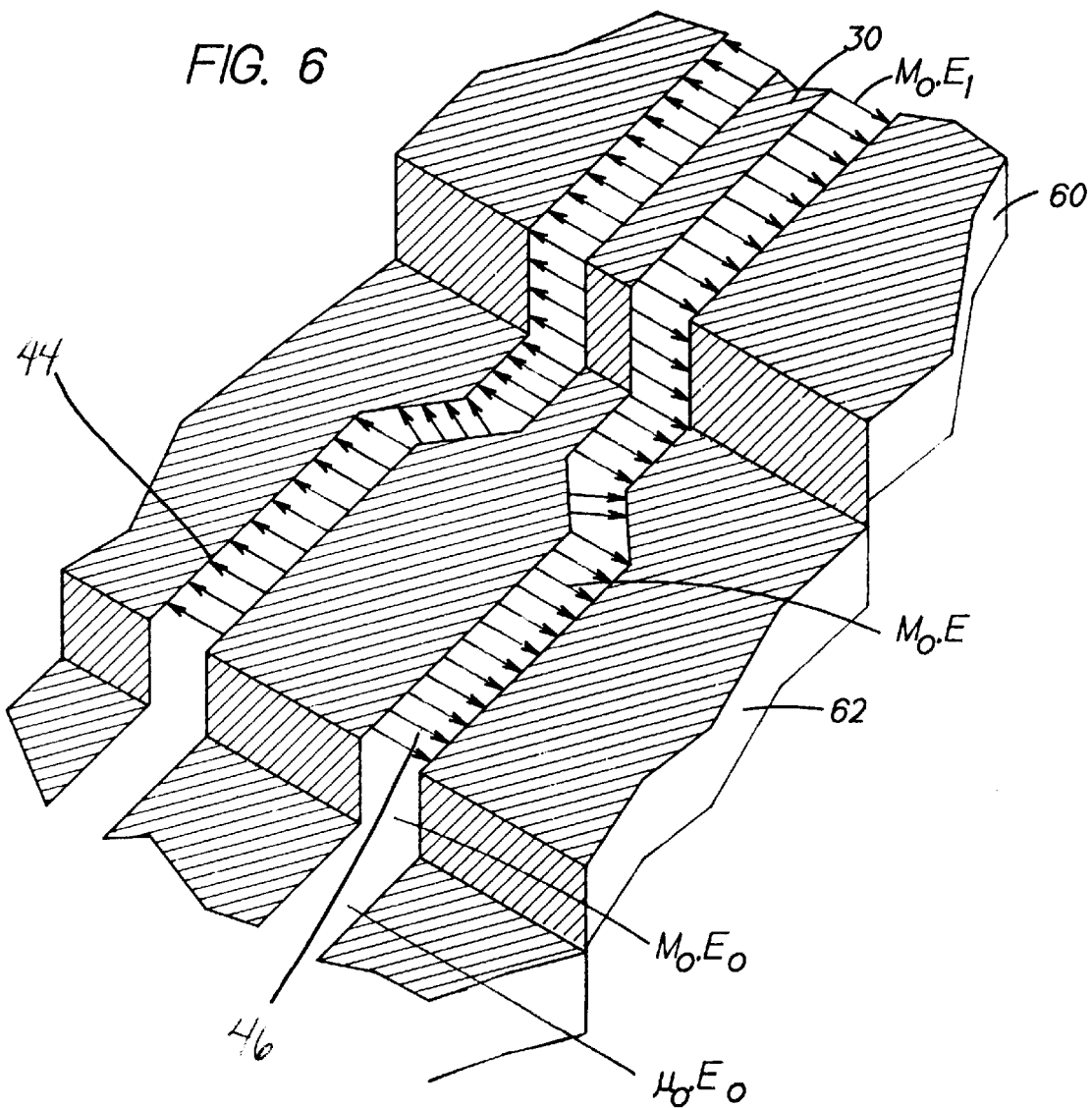
FIG. 6 is a schematic perspective view of the concept of the invention where dielectric constants vary among the materials.

FIG. 6 illustrates schematically how the coplanar waveguide circuit of the invention compensates for changes in the dielectric constant of the materials in each layer of the package and onto the mother PC board. For purposes of simplifying the teaching provided by the Figure, vias of any kind have been replaced by metalization simply extending over the various layers of the invention. The Figure then is particularly adapted to illustrate a change in the width of the signal conductor 30 and the gaps 44 and 46 to compensate for a different dielectric constant in the material of the first level 60 and the second level 62. By expanding the signal conductor 30 and the gaps 44 and 46 for a material having a lower dielectric constant, the overall impedance remains matched through the transitions.

Figure 7:
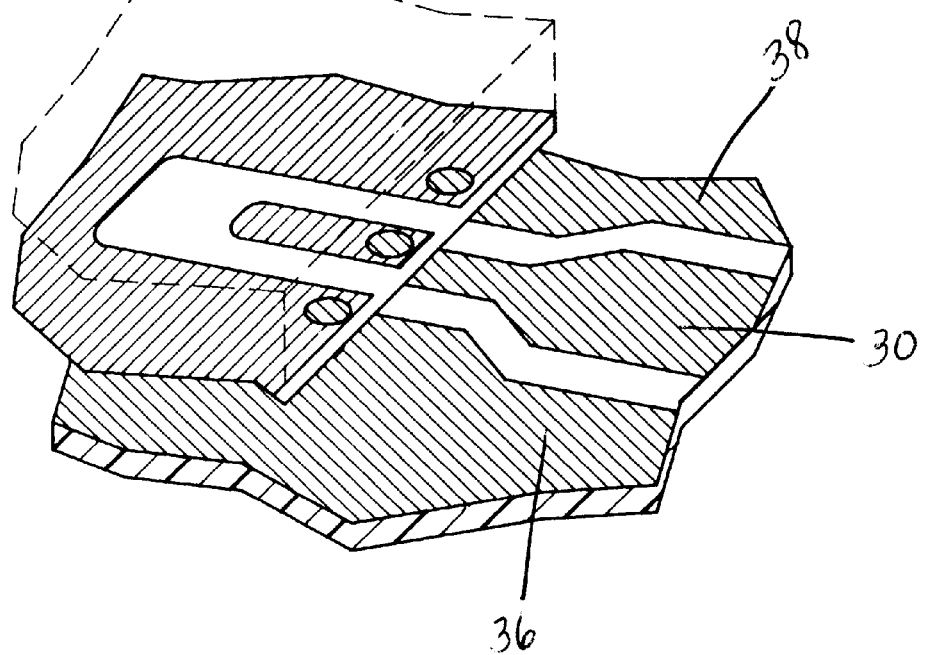
FIG. 7 is a perspective view of the invention illustrating a condition where the dielectric constant of the package is higher than the PC board.
Figure 8:
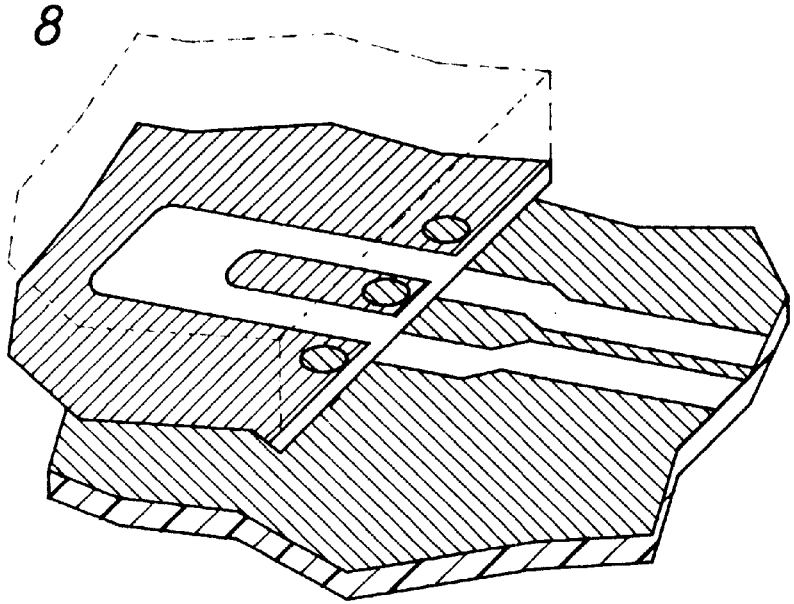
FIG. 8 is a perspective view of the invention illustrating a condition where the dielectric constant of the package is lower than the PC board.

FIG. 7 shows a coplanar waveguide structure on the mother board in which the center conductor 30 width and spaces between that center conductor 30 and ground conductors 36, 38 are larger than the corresponding features on the package bottom waveguide structure. The particular construction avoids impedance change when the dielectric constant of the mother board is lower that of the package substrate material. Typically, Teflon composites have a dielectric constant of 2.2 to 4, whereas that of Alumina is between 9 and 10. It is a well known fact in Microwave Engineering that the characteristic impedance of a transmission line (or waveguide) operating in the TEM mode is inversely proportional to the square root of the dielectric constant of the propagating medium. Consequently, in order to maintain the same characteristic impedance in the package substrate as in the mother board, the cross sectional dimensions of the coplanar waveguide in the mother board need to be enlarged, as shown in FIG. 7. The opposite is true when the dielectric constant of the package substrate is smaller than that of the mother board material, as illustrated in FIG. 8. In addition, a certain waveguide length needs to be provide to reestablish the TEM propagation mode before inserting another transition in the signal path. This is also shown in FIG. 5 and is identified as Δl. The length of Δl will be less than ¼ of the wavelength of the highest propagating frequency in the conductor.

Figure 9:
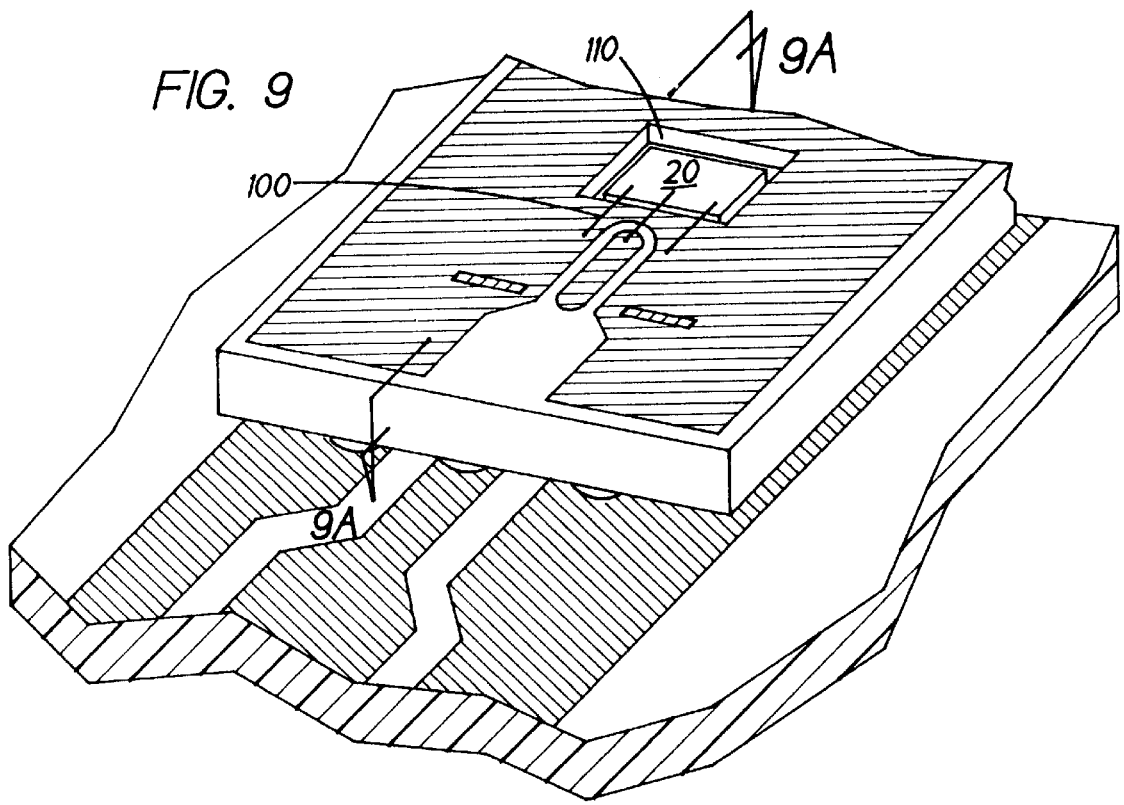
FIG. 9 illustrates an embodiment of the invention in which the MMIC is recessed.
Figure 9A:
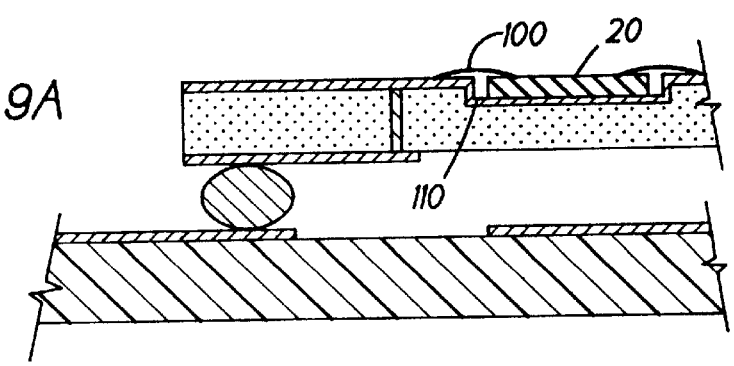
FIG. 9A is a cross section of FIG. 9 taken along section line 9A—9A.

FIG. 9 illustrates an embodiment of the invention wherein the coplanar waveguide construction is employed as above but the inductance of the package has been further lowered by recessing the chip 20 into recess 110. By so recessing, wirebonds 100 are virtually straight. This is illustrated in FIG. 9A. The package has the additional benefit of being shorter in vertical dimension.

Figure 10A:
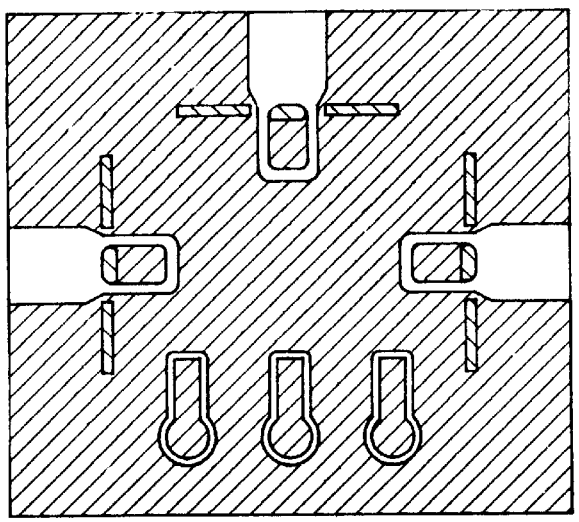
FIG. 10A illustrates the MMIC side of a package of the invention.
Figure 10B:
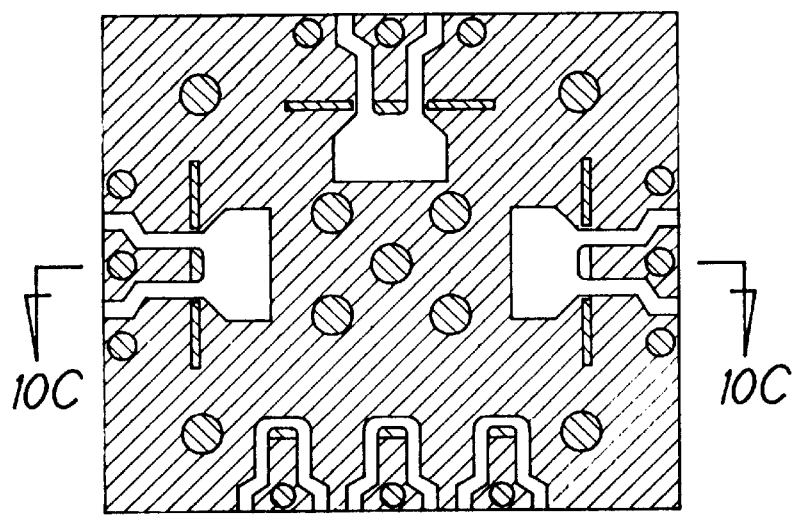
FIG. 10B illustrates the PC board side of a package of the invention.
Figure 10C:
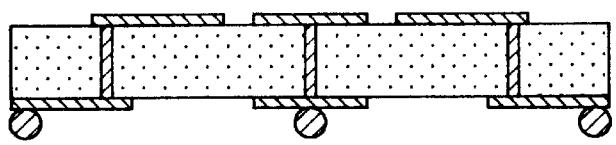
FIG. 10C is a cross section of FIG. 10B taken along section line 10C—10C.

In another specific embodiment of the invention, a package with three RF ports and three DC ports is illustrated in FIGS. 10A–C. FIG. 10A illustrates the MMIC side of the package and FIG. 10B illustrates the PC board side of the package. The layout of the balls or bumps spacing and Δl are all designed to avoid impedance mismatch.

The following are general guidelines for designing packages in accordance to the present invention:

The overall package size is dictated by the number of RF and DC ports, the size of the MMIC(s) to be mounted on the package and any additional package surface area needed for other components (discrete or integrated, such as capacitors, resistors, inductors).

The package RF port characteristic impedance commonly used in the industry is 50 Ohms. Other values however, can also be used. Preferably, the substrate material is about 99.6% (or higher) alumina. The requirements are mechanical and thermal strength, electrical insulating properties and low dielectric losses.

A tradeoff needs to be made between manufacturing capabilities as related to minimum width of the slots, circuit patterning resolution (line width and gaps), minimum diameter of balls/bumps that can be produced in practice, vs cross sectional dimensions of the coplanar waveguide, in view of the characteristic impedance desired. Package substrate thickness is defined by a tradeoff between mechanical strength and cost. It is generally preferable to minimize the substrate thickness and it is generally less expensive to produce the packages in a panel format (for example 2"×2" substrates), but the chances of losses due to thin substrate breakage are increased when the substrate is made thinner. Thus, the cost benefit achieved by panel processing could be negated by the losses due to the breakage.

Once the cross sectional geometry of the RF port is defined (signal conductor width and the width of the spacings to the ground conductors), other parameters are incorporated as follows: width of the slots to connect the bottom and top sides of the package at the signal and ground conductors of the waveguide structures thereof, other grounding balls for DC bias and thermal management balls. It is assumed that the conductive structures have an infinite electrical conductivity and no radiation losses are assumed. Then, the above structure is FEM modeled with, for example, the SONETT software package or other commercially available 3-D Electromagnetic modeling software. A frequency response of the S11, S21 parameters is obtained. As mentioned above, generally there will be dips and spikes in the plots S11 and S21 vs frequently extending beyond the acceptable limits, due to spurious resonances. In order to remove the dips and spikes, size and changes in the locations of balls, slots and other structural elements must be made until a satisfactory plot of S11 and S21 is obtained. It has been found that there is a close correlation between the performance predicted by the model and the actual performance tested with a Network Analyzer, fitted with the properly designed test fixture. Where the actual package when tested exhibits unsatisfactory performance due to radiation losses, fabrication imperfections, etc., further adjustments are made.

It cannot be overemphasized that to achieve a successful package design, it is much more effective to optimize the design by extensive FEM computer modeling before any physical prototypes are built and tested.

Figure 11B:
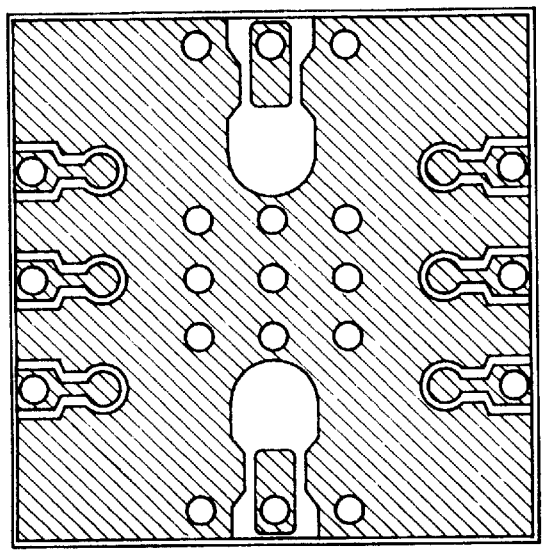
FIG. 11B is a bottom view of the embodiment of FIG. 11A.
Figure 11A:
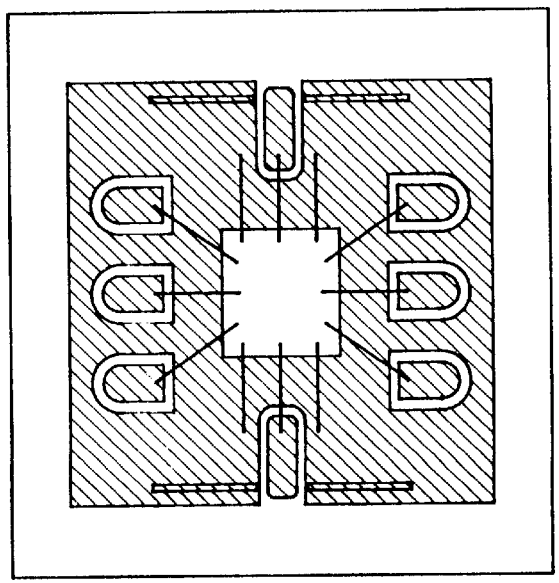
FIG. 11A is a top view of an alternate embodiment of the invention.
Figure 11C:
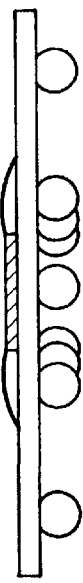
FIG. 11C is a side view of FIG. 11A.
Figure 12:
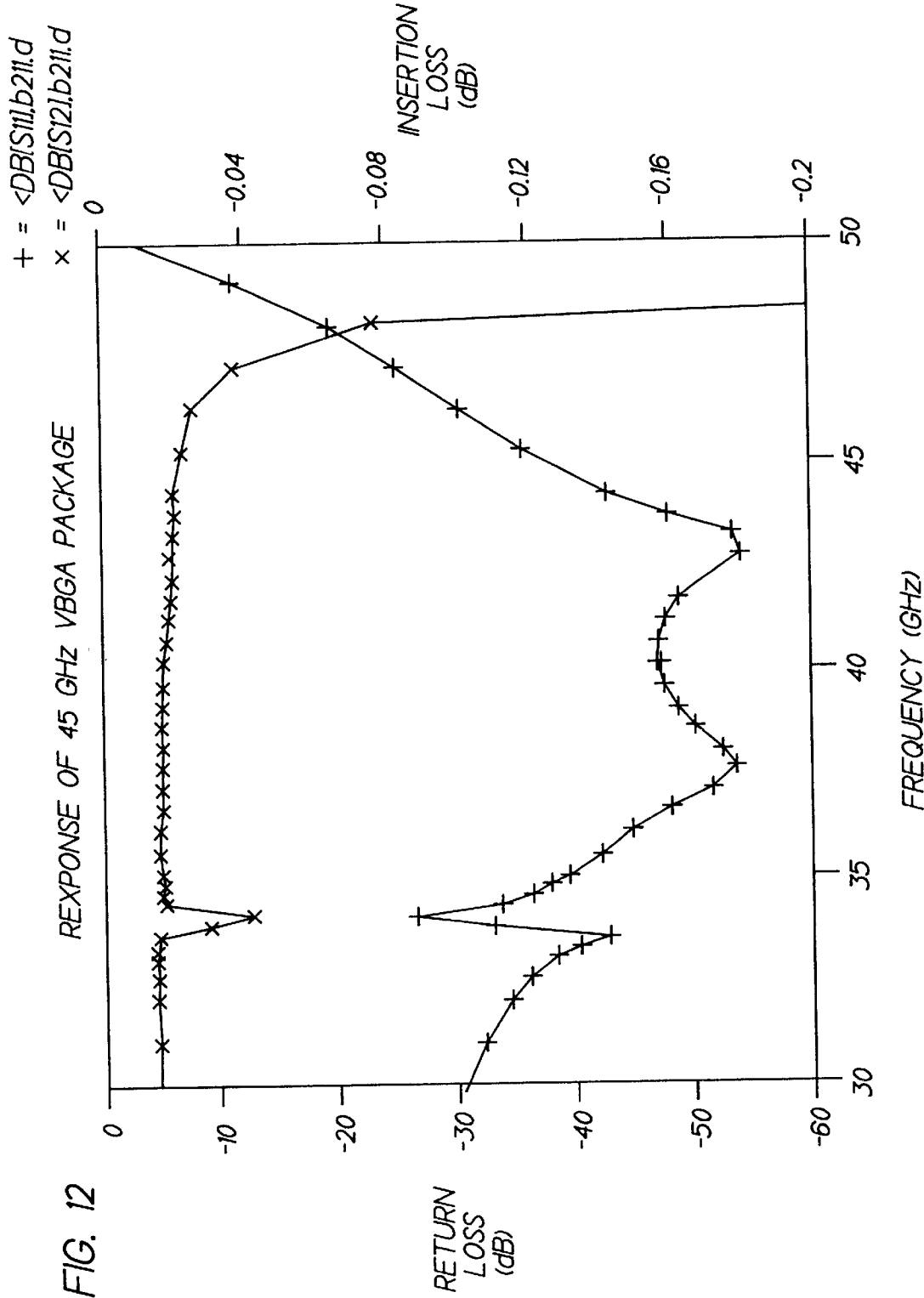
FIG. 12 is a graphic plot plan of a S11, S21 vs frequency layout from a computer modeling of the package illustrated in FIGS. 11A–11C.

FIGS. 11A, 11B and 11C show an actual operational package design that has a frequency performance band from DC to 45 Ghz. The cross sectional dimensions of the coplanar waveguide structure were chosen to produce a characteristic impedance of 50 Ohms. They were arrived at by a careful trade off between substrate material (99.6% Alumina), substrate thickness, kept as high as possible to permit manufacturing in a 2"×2" panel format with minimum breakage, present laser drilling capability (0.004" wide slots) and ball size (0.015" in diameter) handling capability. Those parameters and others such as conductor layer thickness, and cluster of balls for thermal management were entered in the finite element model and optimized to remove peaks and dips in the S11 (return loss) and S21 (insertion loss) plots vs. frequency. Commonly acceptance values for the parameters are:

S11=−1.0 dB maximum (in absolute value), S21=−15.0 dB minimum (in absolute value) over the entire bandwidth of the package. The optimization was achieved through extensive and time consuming computer FEA Electromagnetic modeling, using SONNET, a commercially available EM modeling software package. FIG. 12 shows a plot of S11, S21 vs frequency from the modeled package of FIG. 11.

The top frequency limit of the performance of the package can be maximized as the ideal coplanar waveguide structure is approximated by the physical structure. Clearly, that depends on the materials properties and manufacturing capabilities available, i.e., substrate strength for lower thickness, substrate drilling capability for narrower slots, replacing round bumps with narrow and wide stubs and any other feature that makes the physical structure to be closer in geometry and materials properties to the ideal structure.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A circuit package comprising:

a substrate having a dielectric constant that is substantially equal to a dielectric constant of a mother PC board on which said substrate is mounted;

a metalization pattern disposed upon at least one major surface of said substrate, said metalization pattern being configured as a coplanar waveguide structure having transmission structures substantially uniform in width and thickness and being in electrical communication with said mother PC board;

a microwave monolithic integrated circuit in electrical communication with said coplanar waveguide structure; and at least two conductively filled slots, each of said slots having widths that substantially match a width of said coplanar waveguide structure, each of said slots having thicknesses that are substantially smaller than said widths of said slots, and each of said slots being in electrical communication with said coplanar waveguide structure and said microwave monolithic integrated circuit.

2. A circuit package as claimed in claim 1 wherein said at least two conductively filled slots extend through said substrate to electrically communicate with said metalization pattern of at least one major surface to said metalization pattern on the other major surface of said substrate.

3. A circuit package as claimed in claim 1 wherein said at least two conductively filled slots are positioned to interconnect individual coplanar waveguide structures of said metalization patterns, each of said slots being of width substantially matching the coplanar waveguide structures with which said slots interconnect.

4. A circuit package as claimed in claim 1 wherein said substrate is ceramic.

5. A circuit package as claimed in claim 1 wherein said substrate is electrically connectable to said mother PC board with at least one conductive stub having a width substantially equal to said coplanar waveguide structure with which said conductive stub makes electrical contact.

6. A circuit package as claimed in claim 5 wherein said at least one stub is a plurality of stubs.

\* \* \* \* \*

UNITED STATES PATENT AND TRADEMARK OFFICE
CERTIFICATE OF CORRECTION

PATENT NO.    : 6,215,377 B1
DATED         : April 10, 2001
INVENTOR(S)   : Daniel F. Douriet It is certified that error appears in the above-identified patent and that said Letters Patent is hereby corrected as shown below:

Column 5,
Line 12, after "labeled" delete "Δ1" and insert therefor -- Δℓ --

Signed and Sealed this

Thirtieth Day of November, 2004

JON W. DUDAS
*Director of the United States Patent and Trademark Office*